(12) United States Patent
Stauber

(10) Patent No.: US 8,279,123 B2
(45) Date of Patent: Oct. 2, 2012

(54) HOUSING FOR A SEARCH-ANTENNA POLARIZATION INSTRUMENT

(75) Inventor: Siegfried Stauber, Zürich (CH)

(73) Assignee: Ampass-Explorer Corp., Road Town, Tortola (VG)

( * ) Notice: Subject to any disclaimer, the term of this patent is extended or adjusted under 35 U.S.C. 154(b) by 326 days.

(21) Appl. No.: 12/657,897

(22) Filed: Jan. 29, 2010

(65) Prior Publication Data

US 2010/0134363 A1    Jun. 3, 2010

(30) Foreign Application Priority Data

Aug. 9, 2007 (CH) .................................... 1262/07
Jul. 21, 2008 (WO) ................ PCT/CH2008/000323

(51) Int. Cl.
*H01Q 1/24* (2006.01)

(52) U.S. Cl. ....................................................... 343/702

(58) Field of Classification Search ............. 379/433.01, 379/435; 455/575.1; 370/328–329; D14/240; 343/702, 895

See application file for complete search history.

(56) References Cited

U.S. PATENT DOCUMENTS

| | | | |
|---|---|---|---|
| 4,362,907 A * | 12/1982 | Polacsek | ..................... 455/345 |
| 5,155,659 A * | 10/1992 | Kunert | ..................... 361/679.56 |
| 5,208,734 A | 5/1993 | Someno | |
| 5,734,716 A * | 3/1998 | Kulberg | ..................... 379/433.13 |
| 6,166,695 A * | 12/2000 | Witczak et al. | ............... 343/702 |
| 6,246,863 B1 * | 6/2001 | Kampel | ........................ 455/100 |
| 6,354,680 B1 | 3/2002 | Lin et al. | |
| 7,236,588 B2 * | 6/2007 | Gartrell | ..................... 379/433.01 |
| 7,464,813 B2 * | 12/2008 | Carnevali | ..................... 206/320 |
| 2005/0092632 A1 | 5/2005 | Stanton et al. | |

FOREIGN PATENT DOCUMENTS

| | | |
|---|---|---|
| CH | 696893 | 1/2008 |
| DE | 1821751 | 11/1960 |

* cited by examiner

*Primary Examiner* — Huedung Mancuso
(74) *Attorney, Agent, or Firm* — Horst M. Kasper

(57) ABSTRACT

A housing for a search-antenna polarization instrument is formed by two housing shells (2, 3) which are plugged together in an interlocking manner. A depression can be formed on the outside of the housing, as a positioning surface (12 to 16) for an alignment instrument. Furthermore, a direction-finding groove (19, 20, 21) can be formed on a housing wall. One housing wall may also have a respectively rising extremely profile on two opposite ones of its four side edges. This improves the direction-finding accuracy of a search-antenna polarization instrument.

15 Claims, 2 Drawing Sheets

HOUSING FOR A SEARCH-ANTENNA POLARIZATION INSTRUMENT

Figure 1:
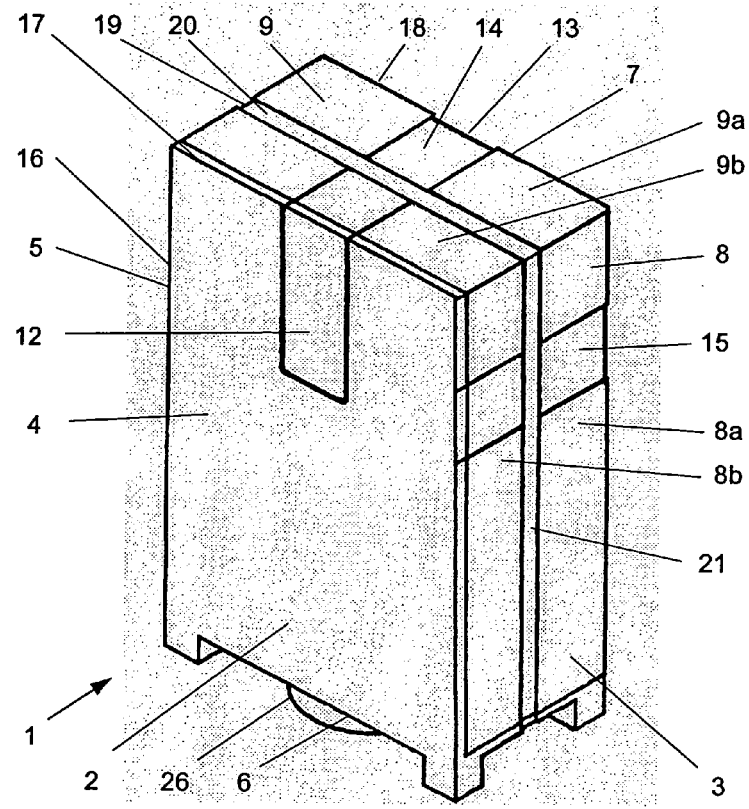

The invention relates to a housing for a search-antenna polarization instrument.

Search-antenna polarization instruments are used as material detector devices for detecting and finding the direction of materials or objects which are being searched for. The detection principle used is described in the Swiss patent application Nr. 2003 0956/03 dated May 28, 2003.

Housings such as those in DE 18 21 751 U, US 2005/092632 A1, U.S. Pat. No. 5,208,734 A and U.S. Pat. No. 6,354,680 B1 are not suitable for a precision instrument such as a search-antenna polarization instrument, because even the way the housing parts are joined together means that the required highly accurate orientation of the interior and exterior surfaces of the walls with respect to each other cannot be guaranteed.

The invention has the aim of producing a housing for a search-antenna polarization instrument by means of which the precision of a direction-finding can be improved.

This task is solved by a housing according to patent Claim 1.

This is characterised firstly by two housing shells which are plugged together in an interlocking manner. The precise fit of the two parts when they are plugged together allows a very exact mutual alignment of the sides and edges of the housing. This makes it possible to achieve a very precise orientation of the housing, for example using sections of the housing walls or using the recesses provided in them. This in turn allows an improvement of the accuracy when taking a bearing.

The housing according to the invention is basically rectangular, cuboid in shape, where each housing shell is formed of exactly three housing walls. This avoids gaps at the joints running across the housing walls, which would hinder a precise placement of external alignment instruments.

Furthermore each housing wall of a housing shell is integrally connected by two adjacent side edges, of its four side edges, to another housing wall. This results in very stable housing shells.

Because the inner faces of the housing walls are oriented precisely at right-angles to each other and are free of oblique deformations, a precise alignment of the interior components of the instrument with respect to the exterior surfaces and edges of the housing is achieved, which favours a high degree of accuracy when taking a bearing.

Furthermore on the outside of one or more housing walls there is a depression formed which serves as a positioning surface for an alignment instrument, in particular for a spirit-level or a laser-pointer. The depression makes it possible to position the alignment instrument very exactly with respect to the housing, and thereby allow a very exact orientation of the housing itself.

A direction-finding groove is formed on the outside of one housing wall or on each of several housing walls. This makes possible a better direction-finding, when detecting a material or object, than by using an edge on the outside of the housing.

Moreover a recess is formed on the outside of one of the housing walls for holding a coil which serves as counter-weight to the antenna, while an antenna may be located inside the housing.

Advantageous embodiments are listed in further Patent Claims.

Thus according to one advantageous embodiment the interlocking connection of the two housing walls can be realised by grooves formed in the long edges of the housing walls and longitudinal ridges on complementary abutting surfaces.

It is also possible, however, to design ridges on the long edges which lock into the corresponding slots in the complementary abutting surfaces.

According to a further, advantageous embodiment the housing shells are made of plastic. Preferably for this one uses dimensionally stable materials with the lowest birefringence, for example PC.

The positioning surface is preferably adapted to match the respective alignment instrument. It can for example be rectangular in shape. Tests have shown that even a shallow recess is sufficient to allow a precise positioning of an alignment instrument. Taking into account the thickness of the housing walls it is advantageous to make the depression for the positioning surface not more than 1.5 mm in depth.

According to a further, advantageous embodiment of the invention, two positioning surfaces are located in pairs opposite each other. By this means a wide supporting base is formed for clipping on, for example, a laser-pointer or similar device.

Preferably one positioning surface runs across a narrow side of the housing transversely to the longitudinal direction of this narrow side.

Preferably one direction-finding groove is located so it runs along a central longitudinal axis of a housing wall, which again improves the accuracy of the direction-finding. In this case, one positioning surface for an alignment instrument or similar such device preferably runs transversely to the direction-finding groove.

For greater flexibility, several direction-finding grooves can be formed on the housing. For example it is possible to provide direction-finding grooves on three narrow sides of the housing.

According to a further, advantageous embodiment of the invention one housing wall has an external profile rising at an angle with respect to two opposite edges of its four side edges. Thus the edges to the left and right on the housing are slightly higher than the area between them. This makes the measurement of the angle easier.

Preferably the external profile is symmetrical, so that it rises from the middle towards the two side edges. For this a direction-finding groove is preferably arranged between two sloping sections of the outside wall which rise to the parallel side edges, being set at a lower level relative to them.

In a preferred embodiment, operating elements by means of which the polarization instrument can be adjusted are arranged on one of the wide sides of the housing. Furthermore the recess can be located around a threaded opening by means of which the housing may, for example, be mounted on a tripod.

In what follows the invention will be explained in more detail using an example embodiment shown in the drawing. The drawing shows in:

FIG. 1 a three-dimensional view of a housing for a search-antenna polarization instrument according to one example embodiment of the invention FIG. 2 a view from above of the housing acc. to FIG. 1, FIG. 3 a view from below of the housing acc. to FIG. 1, FIG. 4 a view of a wide side of the housing acc. to FIG. 1, and in FIG. 5 a view of a narrow side of the housing acc. to FIG. 1.

The FIGS. 1 to 5 show a housing 1 of a polarization instrument which is used as material detector-device for locating materials and objects searched for from a sizeable distance. For this purpose the housing 1 is configured in a special way to improve the accuracy of direction-finding for the detected materials and objects.

Here the housing 1 has two housing shells 2 and 3, which are simply plugged together so as to interlock. Inside the housing 1 there is located a board, not shown in detail here, on which the components required for the measurement are mounted. Also there is a transmission and reception antenna inside the housing, which may be exchanged depending on the object or material searched for. The housing shells 2 and 3 are configured in such a way that the components used for the measurement are located in a specific position in relation to the housing walls and the outer edges of the housing.

Each housing shell 2 and 3 of the basically cuboid-shaped housing 1 is formed by three housing walls 4, 5 and 6, and 7, 8 and 9 respectively. As indicated in FIG. 1, each housing wall of a housing shell is connected integrally at two adjacent side walls of the four side walls it has, to one other housing wall. In this manner there results an edge-connection of three housing walls in each case, which is particularly stable. Moreover joint gaps running through the middle of the housing walls are avoided. In the example embodiment shown, the housing walls 4 and 7 present mutually facing wide sides, the housing walls 5 and 8 mutually facing narrow sides, the housing wall 6 a floor and the housing wall 9 a top side.

The interior of the housing 1 has a rectangular shape. In particular the interior side faces of the housing walls 4 to 9 are here kept in a strictly rectangular form with respect to each other, without any oblique deformation slopes such as are otherwise often found on plastic injection mouldings. For the materials, substances which have as small a birefringence as possible are preferred. In the example embodiment shown the housing shells 2 and 3 are made of PC.

Figure 4:
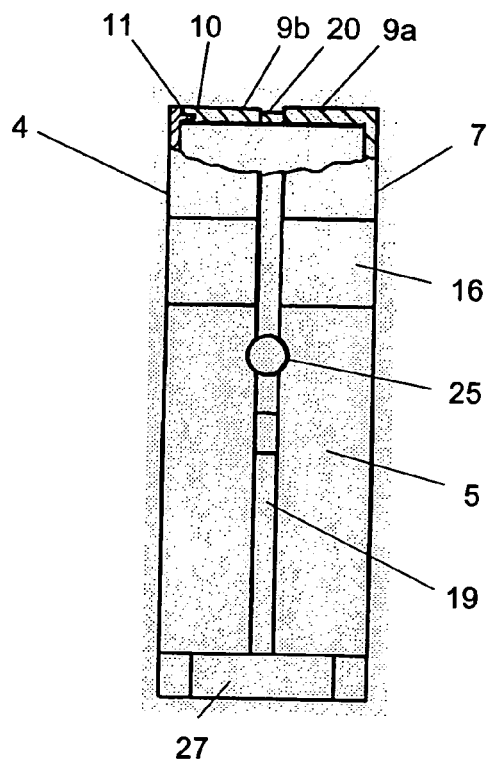
Figure 5:
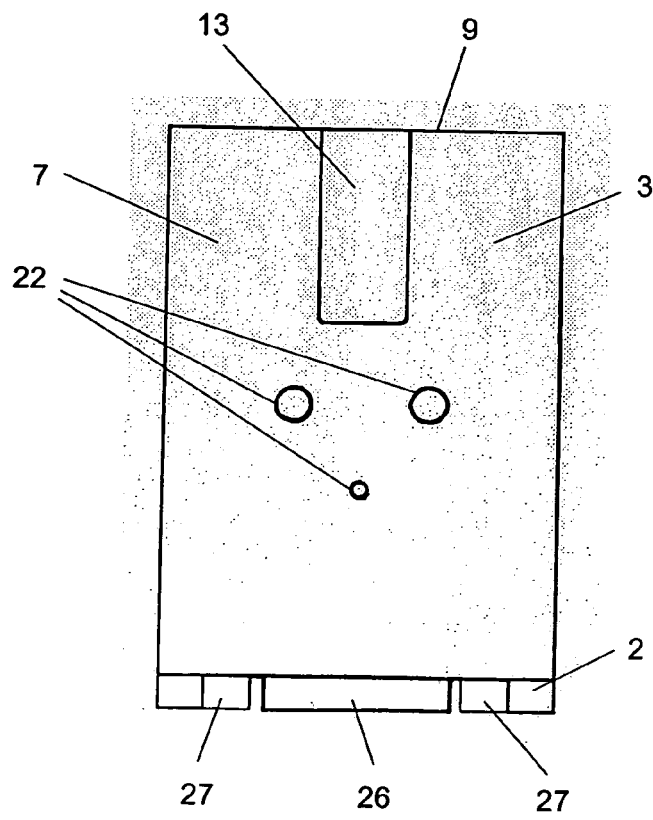

For interlocking together in a smooth fit there are grooves 10 formed on the longitudinal edges of the housing walls, into which lock in the longitudinal ridges 11 on complementary abutting surfaces of the opposite housing walls, as shown in FIG. 4. The grooves 10 basically extend along the whole length of the respective longitudinal edge. The corresponding ridges 11 in each case protrude vertically at right-angles from a wide side of the housing. This configuration avoids any unnecessary weakening of the material when thin housing walls are used. If, however, the housing 1 is made with thicker walls, it is also possible to form ridges on the longitudinal edges of the housing walls which lock into longitudinal grooves on complementary abutting surfaces when pressed together.

The housing 1 has several positioning surfaces 12 to 16, which are recessed into the outside of the housing walls. These positioning surfaces 12 to 16 serve to hold an alignment instrument, for example a spirit level, so that the housing 1 can be precisely oriented with respect to the surroundings when taking a measurement. As the figures show, the positioning surfaces 12 to 16 are preferably located in the upper half of the housing 1. The dimensions of the positioning surfaces, here shown in the example as rectangular, are chosen to fit an alignment instrument which is to be placed on them. To avoid weakening the material the depression is relatively shallow. Even in the range 0.5 to 1.5 mm depth a good hold can be secured.

As shown in FIG. 1, two positioning surfaces 12 and 13 are found on the wide sides 4 and 7, extending to the respective upper edge 17 or 18. The two positioning surfaces are located opposite each other and may also be used jointly for clipping on an alignment instrument, such as a laser-pointer or similar device.

A further positioning surface 14 is located on the upper side 9, and in such a way that it connects together the positioning surfaces 12 and 13.

Further positioning surfaces 15 and 16 are located opposite each other on the narrow sides 5 and 8, and these too may be used for holding a spirit level or for clipping on a laser-pointer. Each of these positioning surfaces runs transversely to the longitudinal direction of the respective narrow side 5 or 8.

In addition to this, there is formed on each of the narrow sides 5 and 8 and the upper side 9 a direction-finding groove 19, 20 and 21 respectively, running longitudinally along each side. Preferably the direction-finding grooves each run in the middle of the side face parallel to two outside edges of the housing 1.

The direction-finding grooves 19, 20 and 21 cut transversely across the positioning surfaces 14, 15 and 16. Here the depth of each of the direction-finding grooves 19, 20 and 21 is deeper than that of the positioning surfaces 14, 15 and 16.

Figure 2:
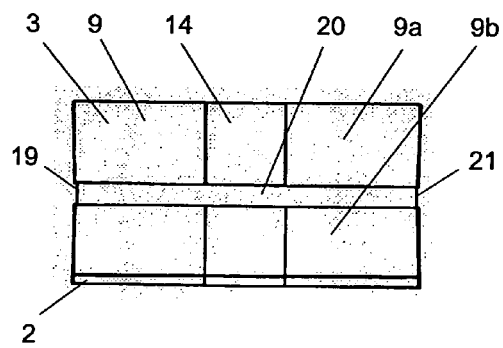
Figure 3:
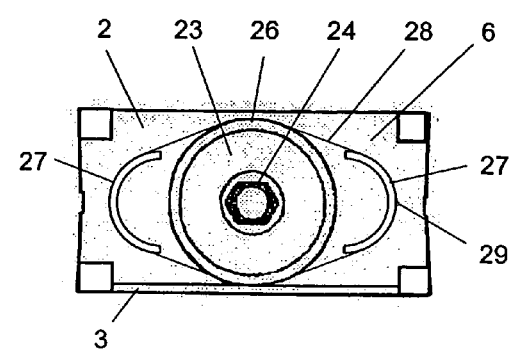

As can be seen in particular from FIGS. 2 to 4, the outside surface of each of the narrow sides 5 and 8 and the upper side 9 is not level but deepens towards the middle longitudinal axis. This in effect results in an outside profile being formed on the said housing walls which rises towards two opposite sides, of the four side edges. The direction-finding grooves 19, 20 and 21 thus run between two sloping outside wall sections 5a, 5b, 8a, 8b, 9a and 9b, which rise towards the parallel side edges. This sloping design allows an easier measurement of angles. By a modification of the example embodiment the direction-finding grooves 19, 20 and 21 can also be formed merely by the abutting edges of these sloping outside wall sections 5a, 5b, 8a, 8b, 9a and 9b.

For adjusting the search-antenna polarization instrument, it may be fitted with one or more operating elements, not shown in detail here, such as adjusting knobs or buttons, which are preferably located on a wide side of the housing 1. For example a knob for adjusting a polarization angle and a further knob for adjusting a tone frequency, can be provided. Furthermore suitable display devices such as a battery-status indicator lamp, etc., can be fitted on the housing. For this purpose suitable openings 22 are formed in the housing 1 on the wide side 7.

In addition to this an opening 25 is provided on the housing 1, which can be used for fitting a headphone connector.

What is more the housing 1 has an annular-groove recess 23 in the outside of its lower wall 6. The recess 23 is bordered around its perimeter by a protruding stop-ridge 26. Next to the recess 23 there are two further protruding ridges 27, in the wide-direction of the housing 1, which are formed in a crescent shape, in each case with the open side of the crescent facing towards the recess 23. The protruding ridges 27 and the protruding stop-ridge 26 are used for holding a coil 28 as antenna counterweight. The counterweight coil 28 wraps round the outside of the protruding stop-ridges 26, 27, forming a kind of oval shape. The coil 28 is preferably wound using wire. This wire leads through an opening 29 in the lower side of the housing into the housing 1.

Furthermore a threaded opening 24 is provided in the lower wall 6, by means of which the housing 1 may for example be mounted on a tripod. In the example shown the recess 23 is positioned around the threaded opening 24. Instead of a tripod a pistol-type or revolver-type handle, such as those available from photo-graphic dealers, can be fixed using the threaded opening 24. The pistol or revolver-type grip-handle is fitted with a battery and the through-connectors for the power supply. The recess 23 serves for the through-connector contacts of the pistol-type handle.

If while taking a measurement the housing 1 is turned to the correct direction and pointed towards the material to be located, the frequency of the tone emitted by the device changes, signalising to the user that it is the right direction. The user can now take a first reading of the direction via the housing. By repeating the procedure from another starting point, the object searched for can be located from the intersection of the two directions measured. Thanks to the features on the housing described above, a great accuracy of direction-finding is achieved.

In the aforegoing the invention has been described in greater detail using one preferred example embodiment. It is not restricted to this, however, but includes all the embodiments defined in the Claims of the patent.

The invention claimed is:

1. Housing of a search-antenna polarization instrument, characterized by two housing shells (2, 3) which are plugged together in an interlocking manner, where the housing which is basically cuboid in shape has six housing walls (4 to 9),
   each housing shell (2, 3) is formed by exactly three of the housing walls (4, 5, 6, 7, 8, 9),
   each housing wall of a housing shell (2, 3) is integrally connected by two adjacent side edges, of its four side edges, to another housing wall,
   the inner faces of adjacent housing walls (4 to 9) are arranged precisely at right angles to each other,
   on the outside of one housing wall at least one ridge (26, 27) is formed for holding a coil as antenna counterweight, while an antenna may be located inside the housing,
   on the outside of one or more housing walls there is, on each one, a depression formed which serves as a positioning surface (12 to 16) for an alignment instrument, and
   a direction-finding groove (19, 20, 21) is formed on the outside of one housing wall or on several housing walls.

2. Housing according to claim 1, characterized in that the interlocking connection is formed by grooves (10) formed in the long edges of the housing walls and protruding longitudinal ridges (11) on complementary abutting surfaces.

3. Housing according to claim 1, characterized in that the interlocking connection is formed by ridges formed in the long edges of the housing walls and longitudinal grooves provided on complementary abutting surfaces.

4. Housing according to claim 1, characterized in that the housing shells (2, 3) are made of plastic.

5. Housing according to claim 1, characterized in that the positioning surface (12 to 16) is rectangular.

6. Housing according to claim 1, characterized in that the depression for the positioning surface (12 to 16) is not more than 1.5 mm in depth.

7. Housing according to claim 1, characterized in that the two positioning surfaces (12 to 16) are each located in pairs opposite each other.

8. Housing according to claim 1, characterized in that one positioning surface (14, 15, 16) runs transversely to a direction-finding groove (19, 20, 21) provided on the outside of the housing.

9. Housing according to claim 1, characterized in that one positioning surface (14, 15, 16) runs across a narrow side of the housing transversely to the longitudinal direction of this narrow side.

10. Housing according to claim 1, characterized in that the direction-finding groove (19, 20, 21) runs along a central longitudinal axis of a housing wall.

11. Housing according to claim 1, characterized in that direction-finding grooves (19, 20, 21) are provided on three narrow sides of the housing.

12. Housing according to claim 1, characterized in that one housing wall (14, 15, 16) has an external profile rising at an angle with respect to two opposite edges of its four side edges.

13. Housing according to claim 12, characterized in that a direction-finding groove (19, 20, 21) is arranged between two sloping sections of the outside wall (5a, 5b, 8a, 8b, 9a, 9b) which rise to the parallel side edges, being set at a lower level relative to them.

14. Housing according to claim 1, characterized in that operating elements are arranged on one of the wide sides of the housing and a threaded opening (24) is located on one lower side of the housing (1).

15. Search-antenna polarization instrument, including: a housing (1) according to claim 1, an antenna located in the housing (1), and
   a coil serving as antenna counterweight (28), which is held on the outside of the housing (1) by at least one ridge.

* * * * *